US008334179B2

(12) United States Patent
Qu et al.

(10) Patent No.: US 8,334,179 B2
(45) Date of Patent: Dec. 18, 2012

(54) SEMICONDUCTOR DEVICE AND METHOD FOR ITS PRODUCTION

(75) Inventors: Ning Qu, Reutlingen (DE); Alfred Goerlach, Kusterdingen (DE)

(73) Assignee: Robert Bosch GmbH, Stuttgart (DE)

( * ) Notice: Subject to any disclaimer, the term of this patent is extended or adjusted under 35 U.S.C. 154(b) by 338 days.

(21) Appl. No.: 12/733,775

(22) PCT Filed: Sep. 17, 2008

(86) PCT No.: PCT/EP2008/062346
§ 371 (c)(1),
(2), (4) Date: Jul. 19, 2010

(87) PCT Pub. No.: WO2009/040279
PCT Pub. Date: Apr. 2, 2009

(65) Prior Publication Data
US 2010/0301387 A1      Dec. 2, 2010

(30) Foreign Application Priority Data
Sep. 21, 2007   (DE) .......................... 10 2007 045 184

(51) Int. Cl.
*H01L 21/8234*      (2006.01)

(52) U.S. Cl. ........ 438/237; 438/379; 438/380; 438/197; 438/22; 438/309; 257/173; 257/579; 257/355; 257/E29.22; 257/77

(58) Field of Classification Search ................. 438/237, 438/379, 38, 197, 22, 309, 421, 43, 564; 257/173, 579, 355, E29.222, 77
See application file for complete search history.

(56) References Cited

U.S. PATENT DOCUMENTS

| 4,134,123 A | 1/1979 | Shannon |
| 2003/0042480 A1 | 3/2003 | Hirose et al. |
| 2003/0141565 A1 | 7/2003 | Hirose et al. |
| 2007/0170514 A1 | 7/2007 | Mauder et al. |
| 2008/0122323 A1 | 5/2008 | Spitz et al. |
| 2009/0057716 A1* | 3/2009 | Rodrigues ..................... 257/173 |
| 2009/0057717 A1* | 3/2009 | Rodrigues ..................... 257/173 |

FOREIGN PATENT DOCUMENTS

| DE | 10 2004 056663 | 6/2006 |
| DE | 10 2005 029263 | 1/2007 |
| JP | 53-20774 | 2/1978 |
| JP | 10-117003 | 5/1998 |
| JP | 2000-294804 | 10/2000 |
| JP | 2002-373000 | 12/2002 |
| JP | 2004-6647 | 1/2004 |
| JP | 2004-72055 | 3/2004 |
| JP | 2005-303027 | 10/2005 |

\* cited by examiner

*Primary Examiner* — Telly Green
(74) *Attorney, Agent, or Firm* — Kenyon & Kenyon LLP

(57) ABSTRACT

A semiconductor system is described, which is made up of a highly n-doped silicon substrate and a first n-silicon epitaxial layer, which is directly contiguous to the highly n-doped silicon substrate, and having a p-doped SiGe layer, which is contiguous to a second n-doped silicon epitaxial layer and forms a heterojunction diode, which is situated above the first n-doped silicon epitaxial layer and in which the pn-junction is situated within the p-doped SiGe layer. The first n-silicon epitaxial layer has a higher doping concentration than the second n-silicon epitaxial layer. Situated between the two n-doped epitaxial layers is at least one p-doped emitter trough, which forms a buried emitter, a pn-junction both to the first n-doped silicon epitaxial layer and also to the second n-doped silicon epitaxial layer being formed, and the at least one emitter trough being completely enclosed by the two epitaxial layers.

14 Claims, 3 Drawing Sheets

SEMICONDUCTOR DEVICE AND METHOD FOR ITS PRODUCTION

FIELD OF THE INVENTION

The present invention relates to a diode having a heterojunction and buried emitter, which is particularly suitable as Z-diode for use in generator systems of motor vehicles. Depending on the use, the breakdown voltage is set up for approximately 20V or 40V, which allows a use in the 14V or 28V vehicle electric system.

BACKGROUND INFORMATION

More and more functions in modern vehicles are realized by electrical components. This creates rising demand for electrical power. In order to satisfy this demand, the efficiency of the generator system in the motor vehicle must be increased. As a rule, silicon diodes are currently used as Z-diodes in the generator system of motor vehicles. Advantages of the cost-effective silicon diodes are their low blocking current and their great robustness.

One disadvantage of silicon diodes is the relatively high forward voltage FV. At room temperature, the current begins to flow only at a FV=0.7V. Under normal operating conditions, e.g., at current densities of 500 A/cm$^2$, the FV rises to more than 1V. These forward power losses reduce the efficiency of the generator considerably. Another disadvantage of silicon diodes is the positive temperature coefficient of the breakdown voltage.

The breakdown voltage of silicon diodes is defined by the avalanche generation and increases with rising temperatures. If Z-diodes are used for limiting the vehicle system voltage, it may therefore no longer be possible to ensure the protective function at high ambient temperatures and special operating conditions (reduced load, load dumping). The voltages in the vehicle electrical system then rise beyond the maximally tolerated value for a brief period of time and lead to damage to electronic components that obtain their supply voltage from the vehicle electrical system.

To reduce the forward power losses, the DE laid-open document 102004056663 refers to the use of so-called high-efficiency diodes (HED) instead of silicon diodes. High-efficiency diodes (HED) are a new type of Schottky diodes, which, in contrast to conventional Schottky diodes, exhibit no barrier-lowering effects caused by the blocking voltage, and therefore have low blocking currents. High-efficiency diodes (HED) are made up of a combination of conventional Schottky diodes with other elements such as magnetoresistive elements, pn-junctions or different barrier metals, the combination being monolithically integrated on a semiconductor chip. They are frequently implemented in trench technique. A HED then includes at least a few trench structures. The trenches are approximately 1-3 μm deep and approximately 0.5-1 μm wide. The use of HEDs makes it possible to realize considerably lower forward voltages FV of approximately 0.5-0.6V.

An alternative to HEDs is the heterojunction diode or HJD referred to in DE laid-open document 102006024850. In contrast to conventional pn-junctions, in which the two differently doped layers are made from the same semiconductor material, e.g., silicon, a heterojunction is formed by a p-doped layer of silicon germanium ($Si_{1-x}Ge_x$), for example, and an n-doped layer of silicon (Si). The index "x" denotes the germanium component in this case. For example, x=0.3 corresponds to a Germanium component of 30%.

One exemplary embodiment of a hetero-junction diode HJD is shown in FIG. 1. The illustrated HJD is made up of an approximately 200 μm thick, highly n-doped silicon substrate 1. Above it is an n-doped silicon epitaxial layer 2 having a thickness of approximately 1.1 μm and a doping concentration of $4.5\times10^{16}$ 1/cm$^3$, for example. Above this layer is SiGe layer 3 having a germanium component of 10-40%. This SiGe layer is approximately 10-50 nm thick and doped with boron at a concentration of $>10^{19}$ 1/cm$^3$. At higher dopings, a stepped p-doping profile is advantageous.

Both the SiGe layer 3 at the topside and silicon substrate 1 at the underside of the chip are provided with metal contacts 4 and 5. These contacts may be made up of a sequence of coatings of chromium, nickel and silver, for instance. Contacts 4 and 5 form the anode and cathode electrodes of the diode. Using heterojunction diodes HJDs makes it possible to achieve forward voltage FV that are smaller than in a conventional diode made from one semiconductor material only.

In contrast to the HEDs referred to in DE laid-open document 102004056663, which are made up of a multitude of very fine structures (<μm), HJDs are easier to produce. The energy barrier of heterojunctions is markedly less dependent on the applied blocking voltage since the characteristic barrier-lowering effects of Schottky diodes do not arise. As a consequence, the blocking currents in HJDs are lower than in conventional Schottky diodes, even without involved measures that must be undertaken in the case of the HED, for example.

An edge structure is required both for conventional silicon diodes and also for the above-mentioned alternatives of HEDs or HJDs. Without edge structure the field intensity at the surface at the chip edge would be higher than in the interior of the chip. This would cause the breakdown to occur already below the desired voltage and to take place in an area that is far too small (excessively high current density!) at the edge of the chip. The field intensity in the edge area of the component is reduced by a suitable edge structure. Thus, the breakdown no longer occurs in the edge region but in the center of the component. One exemplary embodiment of an edge structure are the so-called floating guard rings.

FIG. 2 shows a pn-diode having a guard ring edge structure. As can be gathered from FIG. 2 using the example of a silicon diode, the inner structure of this diode is made up of a highly n-doped silicon substrate 1, a superposed n-doped silicon epitaxial layer 2, and at least one p-doped trough 6 diffused into n-silicon epitaxial layer 2. Metal contacts 4 and 5 form the anode and cathode electrodes of the diode, respectively. The edge structure is made up of at least one circumferential p-doped trough 66 diffused into n-silicon epitaxial layer 2. An oxide layer 7 is situated above the edge region of the component in order to protect the silicon surface from electrical shortcuts as well as from contaminations of different types. Trough 66 is provided in order to expand the space charge region in the edge region so that the field intensity in the edge region of the component is reduced. The breakdown voltage of the diode is then defined not by the edge region but by the center of the diode. The function of trough 66 does not consist of carrying high currents, which is why the circumferential trough usually has relatively narrower dimensions and is called a "ring".

Another example of a pn-diode having an edge structure is the pn-diode having the magnetoresistor edge structure shown in FIG. 3. FIG. 3 also shows a silicon diode made up of the same elements as in FIG. 2: a highly n-doped silicon substrate 1, a superposed n-doped silicon epitaxial layer 2, at least one p-doped trough 6 diffused into the n-silicon epitaxial layer, and a metal contact 5, which once again serves as cathode electrode of the diode. Metal layer 44, which is used as anode electrode of the diode, extends beyond p-doped trough 6 at the edge. An oxide layer 7 is situated between metal 44 and p-doped trough 6 or n-doped silicon epitaxial layer 2. This metal-oxide-Si structure is what is referred to as a magnetoresistive element. It also has the task of expanding the space charge region in the edge region so that the field intensity is reduced in the edge region of the component.

A metal ring 8, which prevents the space charge zone from reaching the chip edge, is situated at the edge of the chip. Such a magnetoresistive-element edge structure also makes it possible for the breakdown to take place in the center of the component. In addition to the two mentioned examples, still other edge structures are known, of course. A shared characteristic is that these structures require additional chip area. Moreover, further process steps or masks are frequently required as well. This entails a higher defect risk. All in all, this results in higher production costs.

Additional structures at the surface of the chip edge also pose a certain quality risk during operation of the components, because both the top surface and also the chip edge are exposed to contamination and mechanical stress to an especially high degree.

SUMMARY OF THE INVENTION

An object of the exemplary embodiments and/or exemplary methods of the present invention includes the creation of a diode that has a low forward voltage and high robustness and which is suitable to be used as Zener diode (z-diode) in generator systems of motor vehicles. This object is achieved by the features of the independent claims.

The power losses of the diodes are advantageously reduced by the lower forward voltage, so that the efficiency of the generator increases. Moreover, the breakdown voltage does not depend on the temperature, or depends on it only to a negligible extent. For that reason the increase in the vehicle electrical voltage in load-dump operation is lower than when using conventional diodes. The load circuits of the vehicle electrical system are therefore better protected against overvoltages. The edge structure of conventional diodes, which is expensive to produce and requires considerable surface space, may be dispensed with, which makes it possible to realize an especially advantageous production method.

The diode of the approach according to the present invention is a heterojunction diode having a buried emitter, and is simply referred to as "HJD-BE" in the following text. The HJD-BE is designed such that the breakdown takes place at the buried emitter, i.e., in the interior of the semiconductor, and not at the sensitive surface or at the edge. The entire breakdown voltage of the HJD-BE is defined by a combination of reach-through breakdown and avalanche breakdown. This yields additional advantages. For example, the forward voltage of the HJD-BE is smaller than in a conventional diode. It is advantageous, in particular, that the breakdown takes place in, the interior of the component. This makes the breakdown very stable because it cannot be affected by electrical charges at the semiconductor surface.

The breakdown voltage has a smaller temperature coefficient than a conventional Z-diode, or is no longer dependent on the temperature at all.

An additional edge structure may advantageously be dispensed with.

DETAILED DESCRIPTION

The following is a detailed description of the structure and function of the together with various alternatives.

Figure 4:
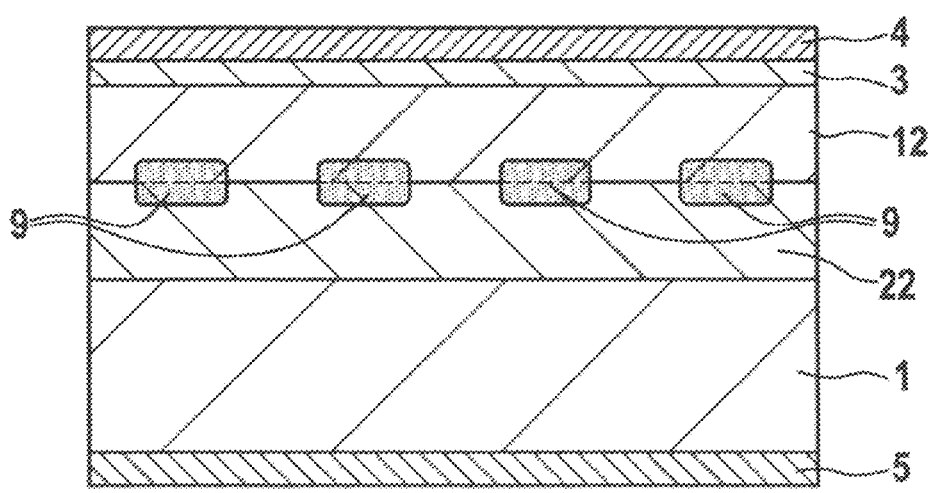
FIG. 4 shows an exemplary embodiment of the present invention, in which a heterojunction diode has a buried emitter.

As illustrated in FIG. 4, HJD-BE according to the exemplary embodiments and/or exemplary methods of the present invention is made up of a highly n-doped silicon substrate 1, a first n-silicon epitaxial layer 22, a second n-silicon epitaxial layer 12, a SiGe layer 3, at least one buried p-doped emitter trough 9, a metal layer at the top surface of chip 4 as Ohmic contact or anode electrode, and a metal layer at the underside of chip 5 as Ohmic contact or cathode electrode. First n-silicon epitaxial layer 22 has a higher doping concentration than second n-silicon epitaxial layer 12. In addition to the pn-junction between p-doped SiGe layer 3 and second n-silicon epitaxial layer 12, pn-junctions are formed both between buried p-doped emitter troughs 9 and first n-silicon epitaxial layer 22 and also between buried p-doped emitter troughs 9 and second n-silicon epitaxial layer 12.

Figure 1:
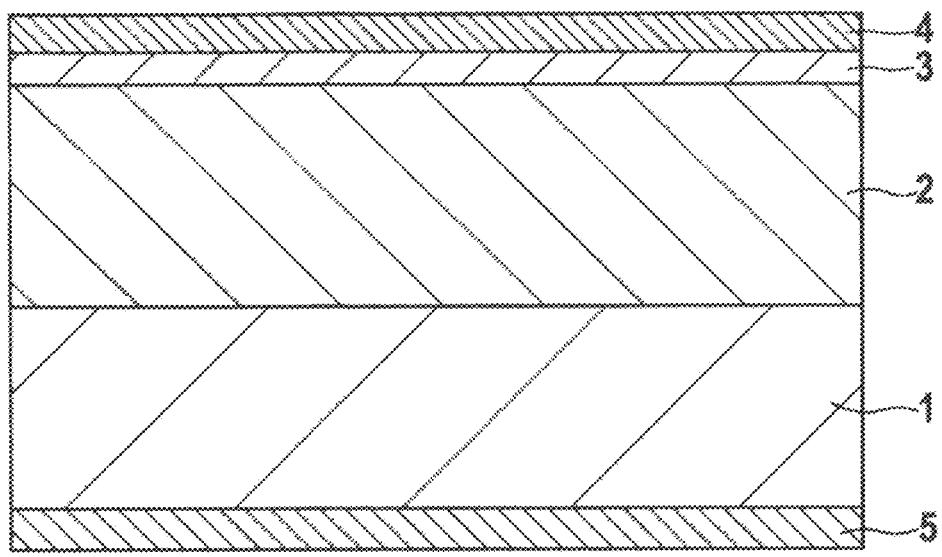
FIG. 1 shows a previous approach for the structure of a semiconductor device having diode properties.
Figure 2:
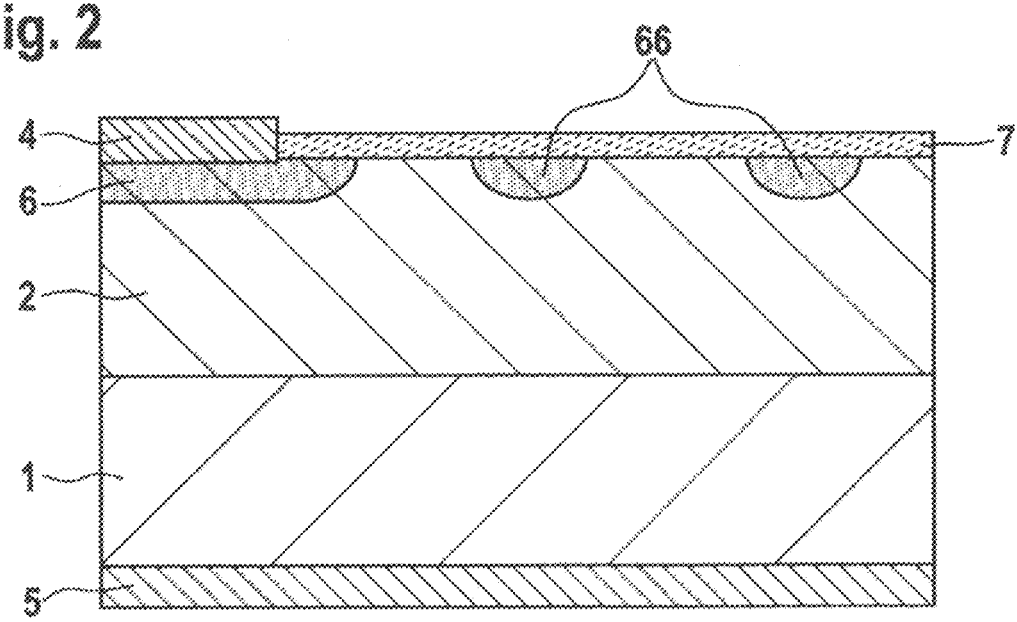
FIG. 2 shows another previous approach for the structure of a semiconductor device having diode properties.
Figure 3:
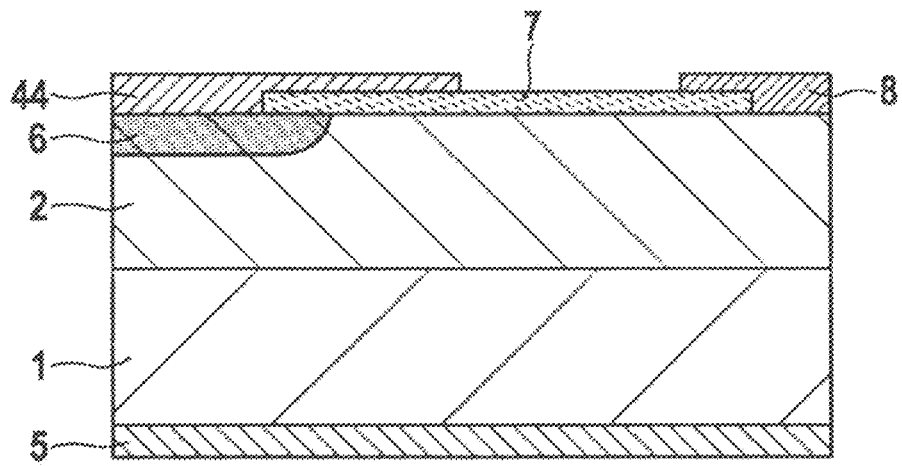
FIG. 3 shows another previous approach for the structure of a semiconductor device having diode properties.

SiGe layer 3, similar to the exemplary embodiment according to FIG. 1, is approximately 10-50 nm thick, has a germanium component of 10-40% and is doped with boron at a concentration of $>10^{19}$ $1/cm^3$. At higher dopings, a stepped p-doping profile is advantageous. In this way it is possible for the forward voltage to be smaller than in the case of a conventional diode made of one semiconductor material only. Unlike in the barrier-lowering effect of a Schottky diode, the energy barrier of heterojunctions is considerably less dependent on the applied blocking voltage. Therefore, the blocking currents in an HJD are lower than in Schottky diodes even without involved measures as they are used for the HED, for example. The breakdown voltage of an HJD-BE of this invention is defined by two substructures and is the sum of the breakdown voltages of the two substructures: BV=BV1+BV2.

The first substructure, which is made up of first n-silicon epitaxial layer 22, buried p-doped emitter troughs 9, and highly n-doped silicon substrate 1, is designed such that its breakdown voltage BV1 is defined by an avalanche breakdown mechanism. This may be achieved by suitable selection of the doping concentration of first n-silicon epitaxial layer 22, the doping concentration of p-doped emitter trough 9, and the clearance between highly n-doped silicon substrate 1 and buried p-doped emitter troughs 9.

In the simplest case, the doping concentration of p-doped emitter trough 9 is selected much higher than the doping concentration of first n-silicon epitaxial layer 22. Then the avalanche breakdown voltage is practically no longer dependent on the doping concentration of p-doped emitter trough 9. This constitutes a one-sided abrupt junction.

The second substructure, which is made up of p-doped SiGe layer 3, second n-silicon epitaxial layer 12, and buried p-doped emitter troughs 9, is designed such that its breakdown voltage BV2 is defined by the so-called reach-through effect. This may be accomplished by suitable selection of the doping concentration of second n-silicon epitaxial layer 12 and the clearance between SiGe layer 3 and buried p-doped emitter troughs 9. The second substructure is a pnp-bipolar structure ("buried emitter").

In the breakdown of an HJD-BE, the location having the highest field intensity—and thus also the avalanche generation of charge carrier pairs—is not at the surface of the component but at the pn-junctions between buried p-doped emitter troughs 9 and first n-doped silicon epitaxial layer 22.

Figure 6:
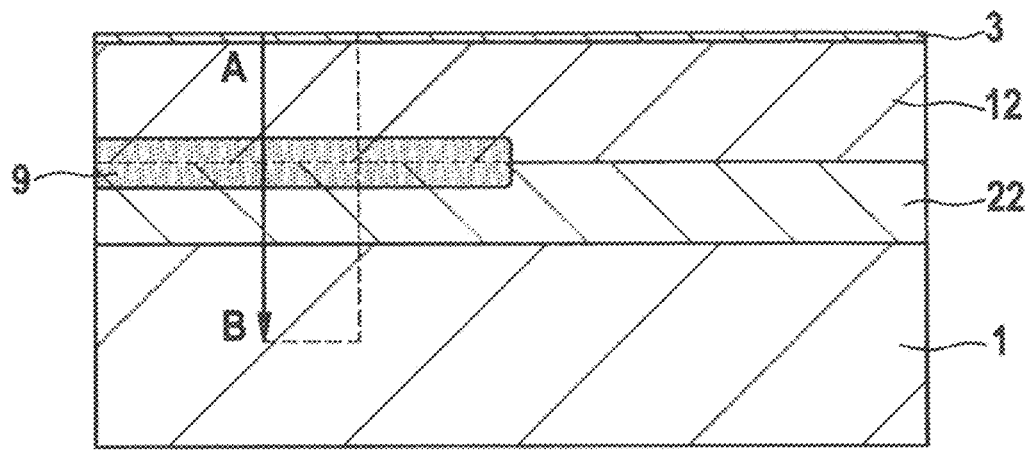
FIG. 6 shows a simulation result for a heterojunction diode including a buried emitter, the structure used in the simulation being shown on top, the electrical field intensity in the middle, and the schematic characteristic of the electrical field intensity at the start of a breakdown along AB being shown at the bottom.
Figure 6:
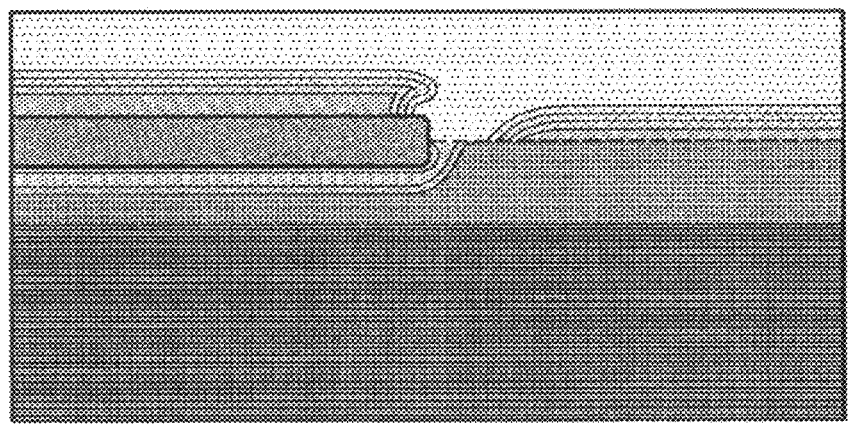
Figure 6:
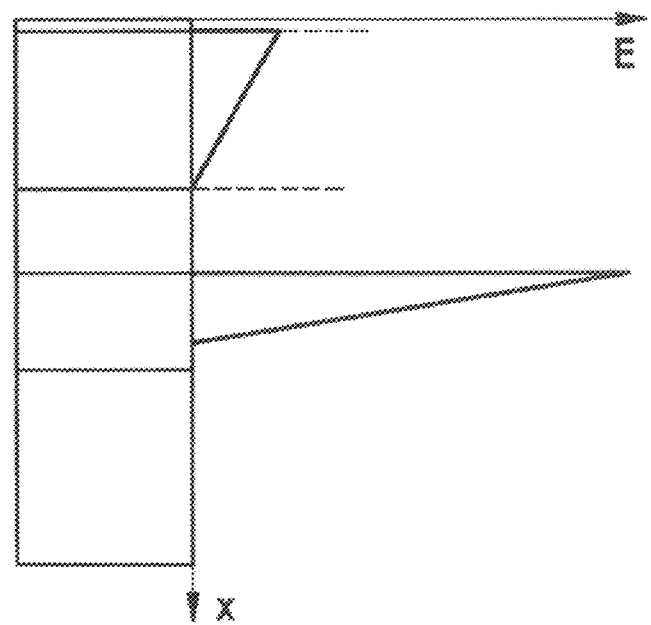

This is shown in FIG. 6 using the example of a simulation result for a heterojunction diode having a buried emitter; the structure used in the simulation is shown on top, the electrical field intensity in the middle, and the schematic characteristic of electrical field intensity E at the start of the breakdown along AB is shown at the bottom.

Since the location of the highest electrical field is located neither at the chip edge nor on the surface but instead is shifted to the interior of the semiconductor, additional complicated edge structures are able to be dispensed with. In addition to savings in chip surface, this also leads to a simpler production process because no additional process steps or masks are required. Since the breakdown takes place in the interior, i.e., is a volume breakdown, the robustness of the component is higher than in an element provided with an edge structure.

The breakdown voltage of first substructure BV1 is defined by an avalanche breakdown and therefore has a positive temperature coefficient, i.e., breakdown voltage BV1 increases with rising temperature. The breakdown voltage of second substructure BV2 is defined by the reach-through effect and has a negative temperature coefficient.

Since the entire breakdown voltage BV of the HJD-BE according to the exemplary embodiments and/or exemplary methods of the present invention is the sum of BV1 having a positive TC and BV2 having a negative TC, breakdown voltage BV has a markedly smaller temperature coefficient than a normal avalanche diode. When choosing a suitable geometry and suitable doping concentrations, there is even the possibility of largely suppressing the temperature dependency of breakdown voltage BV. This is a considerable advantage if the diodes are to be used at high temperatures and high currents for the purpose of restricting the vehicle electrical voltage in generators of motor vehicles.

The structures may basically also be set up for other voltages, in particular for considerably higher voltages. The components can be mounted in known press-fit diode housings with the aid of bilateral soldering. Crystal interference that may arise when separating the chips is able to be removed in the conventional manner by wet or dry etching.

The advantages, i.e., dispensing with the edge structure and smaller or even disappearing temperature coefficient of the breakdown voltage, may of course also be utilized in homogenous pn-junctions in which no heterojunction is present. In such a case p-doped layer 3 according to FIG. 4 does not consist of SiGe, but simply of p-doped silicon again.

The approach according to the exemplary embodiments and/or exemplary methods of the present invention is advantageously also suitable for Schottky diodes. The advantages illustrated for the HJD-BE, such as independent selection of breakdown voltages BV1, BV2, or BV=BV1+BV2,
higher robustness by breakdown in the volume,
as well as the compensation of the temperature coefficient of the breakdown voltage,
may be realized in the case of Schottky diodes as well.

Figure 5:
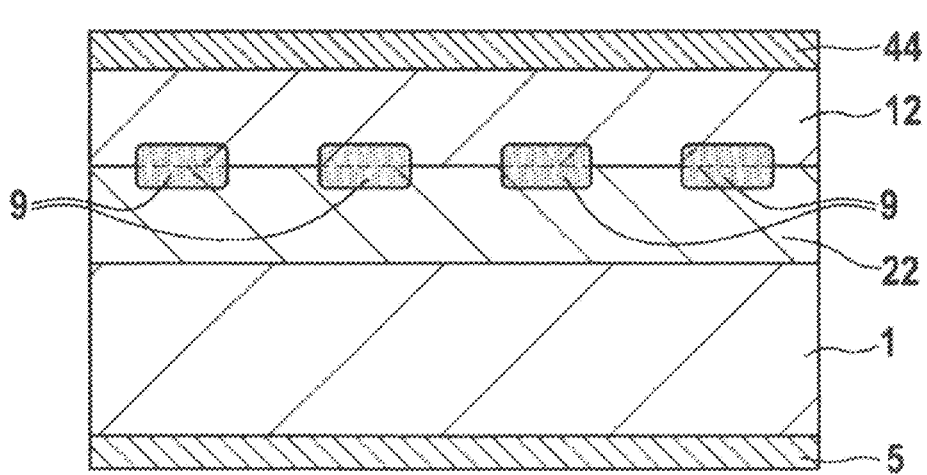
FIG. 5 shows an exemplary embodiment of the present invention, in which a planar Schottky diode has a buried emitter.

As FIG. 5 illustrates, the planar Schottky diode having a buried emitter of this invention is made up of highly n-doped silicon substrate 1, a first n-silicon epitaxial layer 22, a second n-silicon epitaxial layer 12, at least one buried p-doped emitter trough 9, a metal layer at the top surface of chip 44 as Schottky contact or anode electrode, and a metal layer at the underside of chip 5 as Ohmic contact or cathode electrode.

As in the case of the HJD-BE, shown in FIG. 4, first n-silicon epitaxial layer 22 has a higher doping concentration than second n-silicon epitaxial layer 12. In addition to the barrier between Schottky contact 44 and second n-silicon epitaxial layer 12, pn-junctions form both between buried p-doped emitter troughs 9 and first n-silicon epitaxial layer 22 and also between buried p-doped emitter troughs 9 and second n-silicon epitaxial layer 12.

In addition to the planar Schottky diode having a buried emitter, as shown in FIG. 5, the approach according to the exemplary embodiments and/or exemplary methods of the present invention is also even usable in connection with the Schottky diodes having trench structures mentioned in the related art.

Additional special developments are:
The germanium component of p-doped SiGe layer 3 amounts to between 10-40%.
P-doped SiGe layer 3 is doped with boron at a concentration of $>10^{19}$ 1/cm$^3$, the doping profile possibly having a stepped characteristic.

The system having the semiconductor elements is used in rectifiers of motor vehicle generators for the purpose of increasing the generator efficiency. They are suitable for an operation in the breakdown in Zener operation at high currents; and/or suitable for an operation at high barrier layer temperatures, especially >200° C.

Developments are possible in which the breakdown voltage amounts to approximately 20V or 40V. Other developments allow for a breakdown voltage that is considerably higher than 40V.

The HJD-BE is not made of silicon but other materials, in particular III/V compounds, SiC/Si etc. A homogenous junction, in particular p-Si/n-Si, may replace the heterojunction in another development. HJD-BEs in which the sequence of the doping of the coatings is precisely reversed (n instead of p, and p instead of n) are also an option.

In a further development, other semiconductor elements, especially diodes, MOSFETs, IGBTs etc., are provided as edge structure, circumferentially at the edge.

What is claimed is:
1. A semiconductor system, comprising:
a highly n-doped silicon substrate;
a first n-silicon epitaxial layer, which is directly contiguous to the highly n-doped silicon substrate;
a p-doped SiGe layer, which is contiguous to a second n-doped silicon epitaxial layer and forms a heterojunction diode, which is situated above the first n-doped silicon epitaxial layer and in which the pn-junction is disposed within the p-doped SiGe layer, the first n-silicon epitaxial layer having a higher doping concentration than the second n-silicon epitaxial layer; and
at least one p-doped emitter trough lying between the two n-doped epitaxial layers and forming a buried emitter, a pn-junction both to the first n-doped silicon epitaxial layer and also to the second n-doped silicon epitaxial layer being formed, and the at least one emitter trough being completely enclosed by the two epitaxial layers.
2. The system of claim 1, wherein the first substructure, made up of the highly n-doped silicon substrate, the first n-silicon epitaxial layer, and the buried p-doped emitter troughs, is set up so that its breakdown voltage BV1 is defined by the avalanche breakdown, and the second substructure, made up of the buried p-doped emitter troughs, the second n-silicon epitaxial layer and the SiGe layer, is set up so that its breakdown voltage BV2 is defined by the reach-through effect, and the entire breakdown voltage BV=BV1+BV2.

3. The system of claim 1, wherein the breakdown voltage of the first substructure BV1 has a positive temperature coefficient, and the breakdown voltage of the second substructure BV2 has a negative temperature coefficient, so that the entire system has a very low or even disappearing temperature coefficient of the breakdown voltage BV.

4. The system of claim 1, wherein the germanium component of the p-doped SiGe layer lies between 10 to 40%.

5. The system of claim 1, wherein the p-doped SiGe layer is doped with boron at a concentration of greater than $10^{19}$ 1/cm$^3$, the doping profile having a stepped characteristic.

6. The system of claim 1, wherein it is used in a rectifier of a generator for a motor vehicles to increase a generator efficiency.

7. The system of claim 1, wherein it is suitable for at least one of an operation in the Z-breakdown at high currents, and for an operation at high barrier layer temperatures, in particular greater than 200° C.

8. The system of claim 1, wherein one of the SiGe and Si areas are replaced by other semiconductor materials, including at least one of III/V compounds or Si.

9. The system of claim 1, wherein the breakdown voltage amounts to approximately 20V or 40V.

10. The system of claim 1, wherein the breakdown voltage is substantially higher than 40V.

11. The system of claim 1, wherein the heterojunction p-SiGe/n-Si is replaced by a homogenous junction, which is p-Si/n-Si.

12. The system of claim 1, wherein, circumferentially along the edge, it has at least one other semiconductor element, including at least one of a diode, a MOSFET, and an IGBT, as an edge structure.

13. The system of claim 1, wherein the sequence of the doping of the layers is precisely reversed.

14. The system of claim 1, wherein the p-doped SiGe layer is omitted, and the junction between a metal layer and the second n-silicon epitaxial layer is configured as a Schottky contact.

* * * * *